United States Patent
New et al.

(10) Patent No.: US 7,068,072 B2
(45) Date of Patent: Jun. 27, 2006

(54) INTEGRATED CIRCUIT WITH INTERFACE TILE FOR COUPLING TO A STACKED-DIE SECOND INTEGRATED CIRCUIT

(75) Inventors: Bernard J. New, Carmel Valley, CA (US); Robert O. Conn, Los Gatos, CA (US); Steven P. Young, Boulder, CO (US); Edel M. Young, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 356 days.

(21) Appl. No.: 10/610,207

(22) Filed: Jun. 30, 2003

(65) Prior Publication Data

US 2004/0268286 A1 Dec. 30, 2004

(51) Int. Cl.
*H03K 19/173* (2006.01)

(52) U.S. Cl. ............... 326/47; 326/101; 257/685; 257/686

(58) Field of Classification Search ............ 326/47, 326/101; 257/685, 686
See application file for complete search history.

(56) References Cited

U.S. PATENT DOCUMENTS

| | | | |
|---|---|---|---|
| 5,162,260 A | 11/1992 | Leibovitz et al. | |
| 5,270,261 A | 12/1993 | Bertin et al. | |
| 5,323,060 A | * | 6/1994 | Fogal et al. ............ 257/777 |
| 5,327,327 A | 7/1994 | Frew et al. | |
| 5,380,681 A | 1/1995 | Hsu | |
| 5,481,133 A | 1/1996 | Hsu | |
| 5,502,333 A | * | 3/1996 | Bertin et al. ............ 257/685 |
| 5,521,122 A | 5/1996 | Kuramochi | |
| 5,552,633 A | 9/1996 | Sharma | |
| 5,561,622 A | 10/1996 | Bertin et al. | |
| 5,568,574 A | 10/1996 | Tanguay, Jr. et al. | |
| 5,629,563 A | 5/1997 | Takiar et al. | |
| 5,633,530 A | 5/1997 | Hsu | |
| 5,652,811 A | 7/1997 | Cook et al. | |
| 5,682,107 A | 10/1997 | Tavana et al. | |
| 5,715,197 A | 2/1998 | Nance et al. | |
| 5,804,004 A | * | 9/1998 | Tuckerman et al. ......... 156/60 |
| 5,880,598 A | 3/1999 | Duong | |

(Continued)

OTHER PUBLICATIONS

Alex Romanelli, "Intel Stacks Flash Deck in its Favor," Electronic News, Apr. 10, 2003, available from Reed Electronics Group @ http://www.e-insite.net/electronicnews/index.asp?layout=article&articleid=CA291318.

(Continued)

*Primary Examiner*—Vibol Tan
(74) *Attorney, Agent, or Firm*—T. Lester Wallace; Justin Liu; Edel M. Young

(57) ABSTRACT

A general purpose interface tile of a first integrated circuit includes a plurality of micropads. A second integrated circuit may be stacked on the first integrated circuit such that signals from the second integrated circuit are communicated through the micropads and the interface tile to other circuitry on the first integrated circuit. Similarly, signals from the first integrated circuit are communicated through the interface tile and the micropads to the second integrated circuit. In the event that the first integrated circuit is a programmable logic device having a programmable interconnect structure, the interface tile is part of and hooks into the programmable interconnect structure and provides a general purpose mechanism for coupling signals from the second integrated circuit to the programmable interconnect structure and/or for coupling signals from the programmable interconnect structure to the second integrated circuit.

41 Claims, 9 Drawing Sheets

U.S. PATENT DOCUMENTS

| | | | |
|---|---|---|---|
| 5,905,639 A * | 5/1999 | Warren | 361/776 |
| 5,914,616 A | 6/1999 | Young et al. | |
| 5,990,501 A | 11/1999 | Hiyoshi et al. | |
| 6,099,583 A | 8/2000 | Nag | |
| 6,114,221 A | 9/2000 | Tonti et al. | |
| 6,191,613 B1 | 2/2001 | Schultz et al. | |
| 6,255,736 B1 | 7/2001 | Kaneko | |
| 6,271,059 B1 | 8/2001 | Bertin et al. | |
| 6,337,579 B1 * | 1/2002 | Mochida | 326/41 |
| 6,368,930 B1 | 4/2002 | Enquist | |
| 6,396,302 B1 | 5/2002 | New et al. | |
| 6,410,431 B1 | 6/2002 | Bertin et al. | |
| 6,444,560 B1 | 9/2002 | Pogge et al. | |
| 6,501,663 B1 * | 12/2002 | Pan | 361/779 |
| 6,580,164 B1 * | 6/2003 | Ohie | 257/690 |
| 6,849,951 B1 * | 2/2005 | Trimberger et al. | 257/777 |
| 6,917,219 B1 * | 7/2005 | New | 326/41 |
| 2001/0030555 A1 | 10/2001 | Witting et al. | |
| 2002/0008309 A1 | 1/2002 | Akiyama | |
| 2002/0064906 A1 | 5/2002 | Enquist | |

OTHER PUBLICATIONS

Kaustav Banerjee, Shukri J. Souri, Pawan Kapur and Krishna C. Saraswat, "3-D ICs: A Novel Chip Design for Improving Deep-Submicrometer Interconnect Performance and Systems-on-Chip Integration," IEEE, May 2001, pp. 602-633, vol. 89., No. 5, available from Center for Integrated Systems, Stanford University, Stanford, CA., 94305.

Virtex-II Pro Platform FPGA's Functional Description, Advanced Product Specification, DS083-2, Sep. 27, 2002, pp. 27-71, (v2.2), available from Xilinx, Inc., 2100 Logic Drive, San Jose, CA 95124.

* cited by examiner

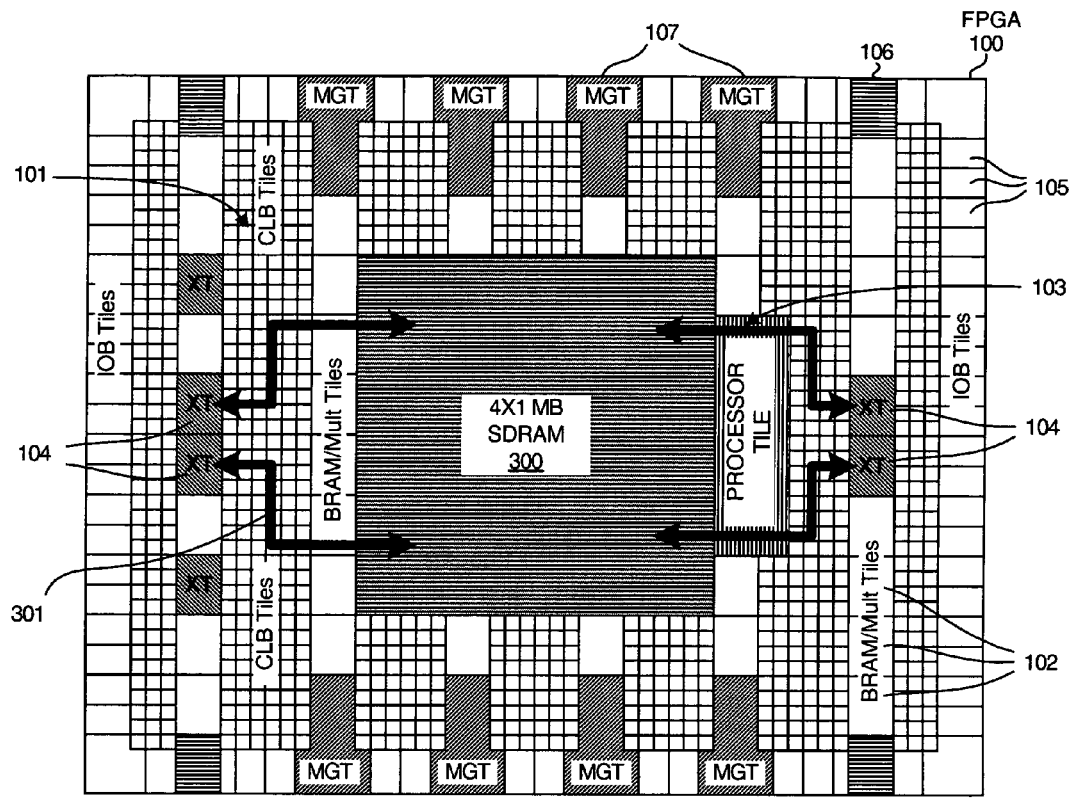
FIG. 7
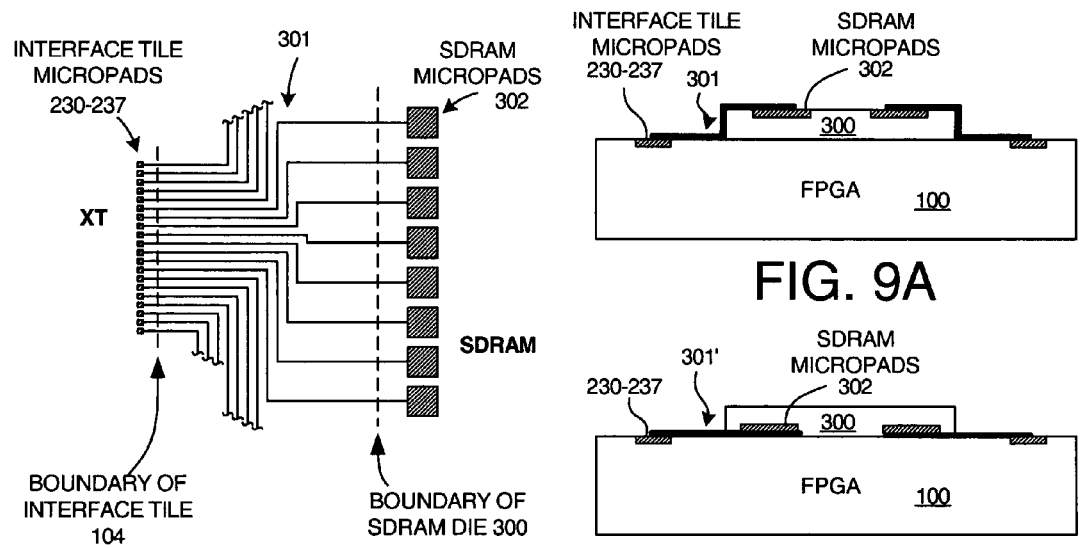
FIG. 8
FIG. 9A
FIG. 9B

INTEGRATED CIRCUIT WITH INTERFACE TILE FOR COUPLING TO A STACKED-DIE SECOND INTEGRATED CIRCUIT

FIELD OF THE INVENTION

The present invention relates to multi-chip integrated circuits, particularly multi-chip programmable logic devices.

BACKGROUND OF THE INVENTION

Programmable logic devices (PLDs), such as field-programmable gate arrays (FPGAs), are user-programmable integrated circuits that can be programmed to implement user-defined logic circuits. In a typical FPGA architecture, an array of configurable logic blocks (CLBs) and a programmable interconnect structure are surrounded by a ring of programmable input/output blocks (IOBs). Each of the CLBs, the programmable interconnect structure, and the IOBs includes configuration memory cells, the contents of which determine how the CLB, the programmable interconnect structure, or the IOB is configured. To realize a user-defined circuit, configuration data is loaded into the configuration memory cells such that the CLBs and IOBs are configured to realize particular circuit components used in the user-defined circuit. Configuration data is also loaded into the configuration memory cells of the programmable interconnect structure such that the programmable interconnect structure connects the various configured CLBs and IOBs in a desired manner to realize the user-defined circuit.

FIG. 1 (Prior Art) is a simplified conceptual diagram of one type of modern FPGA 1 available from Xilinx, Inc. of San Jose, Calif. FPGA 1 includes a central matrix of CLB tiles 2 with strips BRAM/Mult (Block Random Access Memory/Multiplier) tiles 3, a microprocessor core 4, DCM (Digital Clock Manager) tiles 5, MGT (multi-gigabit transceiver) tiles 6, and a ring of IOB tiles 7. All of the tiles including the CLB tiles, BRAM/Mult tiles and IOB tiles contain logic circuitry as well as a portion of the programmable interconnect structure of the composite FPGA. This portion of the programmable interconnect structure includes a switch box and a plurality of routing conductor segments. The routing conductor segments of the tiles are fashioned such that when the tiles are placed adjacent to one another, the routing conductor segments of adjacent tiles together form routing conductors of the programmable interconnect structure of the FPGA. These routing conductors allow the logic circuitry within the tiles to be interconnected in the desired way to realize the user-defined circuit.

For additional information on a tile FPGA architecture, see: 1) U.S. Pat. No. 5,914,616 by Young et al.; 2) the Advance Product Specification entitled "Virtex-II Pro Platform FPGAs: Functional Description", Sep. 27, 2002; 3) Published U.S. Patent Application US2001/0030555-A1 by Wittig et al.; and 4) U.S. Pat. No. 6,396,302, by New et al. The subject matter of these four documents is incorporated herein by reference.

Advanced state-of-the-art FPGA's, such as FPGA 1, are complex and large integrated circuits. As FPGAs have grown in size and become more complex, structures that are not always used in all user-defined designs have been incorporated onto FPGAs. Examples of these structures include large blocks of RAM, microprocessors, and high voltage I/O circuitry. FPGA users often differ in their desire to use these structures.

In the example of FPGA 1 some user-defined designs may, for example, involve additional RAM for use of the microprocessor 4 whereas other user-defined designs would not use such additional RAM. For an FPGA user who does not want or need this extra RAM structure, having to purchase an FPGA that involves this unwanted RAM structure involves an undesirable cost. Accordingly, it is desirable to be able to offer FPGAs both with and without such extra structures that are not universally desired.

In addition to being able to offer FPGAs both with and without such extra structures, it is also desirable to be able to reduce the manufacturing cost of the most advanced state-of-the-art FPGAs. The most advanced FPGAs typically have the most functionality. To provide that functionality, a large integrated circuit is generally required. The size of the integrated circuit can push the limits of current integrated circuit manufacturing technology. The result is that new large FPGAs, when they are first offered, generally have a low manufacturing yield. This low yield translates into a higher manufacturing cost. It would be desirable to be able to produce simpler and therefore more manufacturable FPGAs that nevertheless provide the same functionality as the most advanced state-of-the-art FPGAs.

In addition to FPGAs becoming larger, the logic structures required on FPGAs have become more complex. Some of the functions to be performed by contemporaneous FPGAs are best performed using certain types of circuit structures and processes whereas other functions to be performed by contemporaneous FPGAs are best performed using other types of circuit structures and processes. Complex and expensive integrated circuit manufacturing processes are therefore often necessary to realize all the different types of circuit structures desired on the same FPGA integrated circuit. It would be desirable to reduce the complexity and cost associated with making such FPGAs. A solution is desired.

SUMMARY

A general purpose interface tile of a first integrated circuit includes a plurality of micropads. A second integrated circuit is stacked on the first integrated circuit such that signals from the second integrated circuit are communicated through the micropads and the interface tile to other circuitry on the first integrated circuit. Similarly, signals from the first integrated circuit are communicated through the interface tile and the micropads to the second integrated circuit.

In one embodiment, the first integrated circuit is a field programmable gate array having a programmable interconnect structure. The interface tile connects to and is part of the programmable interconnect structure of the field programmable gate array. The interface tile provides a general purpose mechanism for coupling signals from a second integrated circuit to the programmable interconnect structure and/or for coupling signals from the programmable interconnect structure to the second integrated circuit. Layout and design of the field programmable gate array is facilitated if portions of the interface tile are identical to portions of another type of tile used in the field programmable gate array.

A field programmable gate array integrated circuit may include a plurality of such interface tiles. In one embodiment, the second integrated circuit is disposed on a field programmable gate array such that the back side of the second integrated circuit contacts the face side of the field programmable gate array. Micropads on the field programmable gate array are coupled to corresponding micropads on the second integrated circuit by metal traces that extend from the micropads on the field programmable gate array, across the surface of the field programmable gate array to the edge of the second integrated circuit, up the edge of the second integrated circuit, and across the face side surface of the second integrated circuit to micropads on the second integrated circuit. The second integrated circuit is previously thinned, thereby facilitating formation of these metal traces.

In another embodiment, a pattern of micropads on the field programmable gate array substantially matches a pattern of micropads on the second integrated circuit such that when the field programmable gate array and the second integrated circuit are brought together in a face-to-face relation, the micropads on the two integrated circuits touch and form electrical connections between the two integrated circuits.

In one embodiment, state-of-the-art field programmable gate array devices having a large amount of functionality are produced by providing part of the functionality on the underlying field programmable gate array die and providing the remainder of the functionality on the second integrated circuit. By decreasing the size of the field programmable gate array required to provide the functionality of the composite multi-die structure, yield of the field programmable gate array is increased and manufacturing cost of the field programmable gate array is decreased.

Where somewhat specialized circuitry is desired by a subset of field programmable gate array users, multiple different second integrated circuits are provided, each being designed to carry out a different specialized function. To satisfy a demand for a field programmable gate array having a somewhat specialized function, a general purpose field programmable gate array is combined with a second integrated circuit that has the more specialized circuitry. A number of different types of field programmable gate arrays can therefore be realized by combining general purpose field programmable gate array dice with different types of second integrated circuits.

If an application requires somewhat specialized circuit structures (for example, specialized transistors) made by a process different than the logic circuit structure-process used to make the field programmable gate array integrated circuit, then the specialized circuit structures can be provided on the second integrated circuit. In this way, manufacturing complexities and costs associated with making the two types of circuit structures on the same die are avoided.

Other structures and methods are described in the detailed description below. This summary does not purport to define the invention. The invention is defined by the claims.

BRIEF DESCRIPTION OF THE FIGURES

FIG. 7 is a diagram showing how a second integrated circuit is connected to the interface tiles of FPGA 100.

FIG. 8 is a more detailed diagram showing how the second integrated circuit of FIG. 7 is connected to the interface tiles of FPGA 100.

FIGS. 9A and 9B are cross-sectional diagrams showing how the second integrated circuit of FIG. 7 may be connected to the interface tiles of FPGA 100.

DETAILED DESCRIPTION

Figure 1:
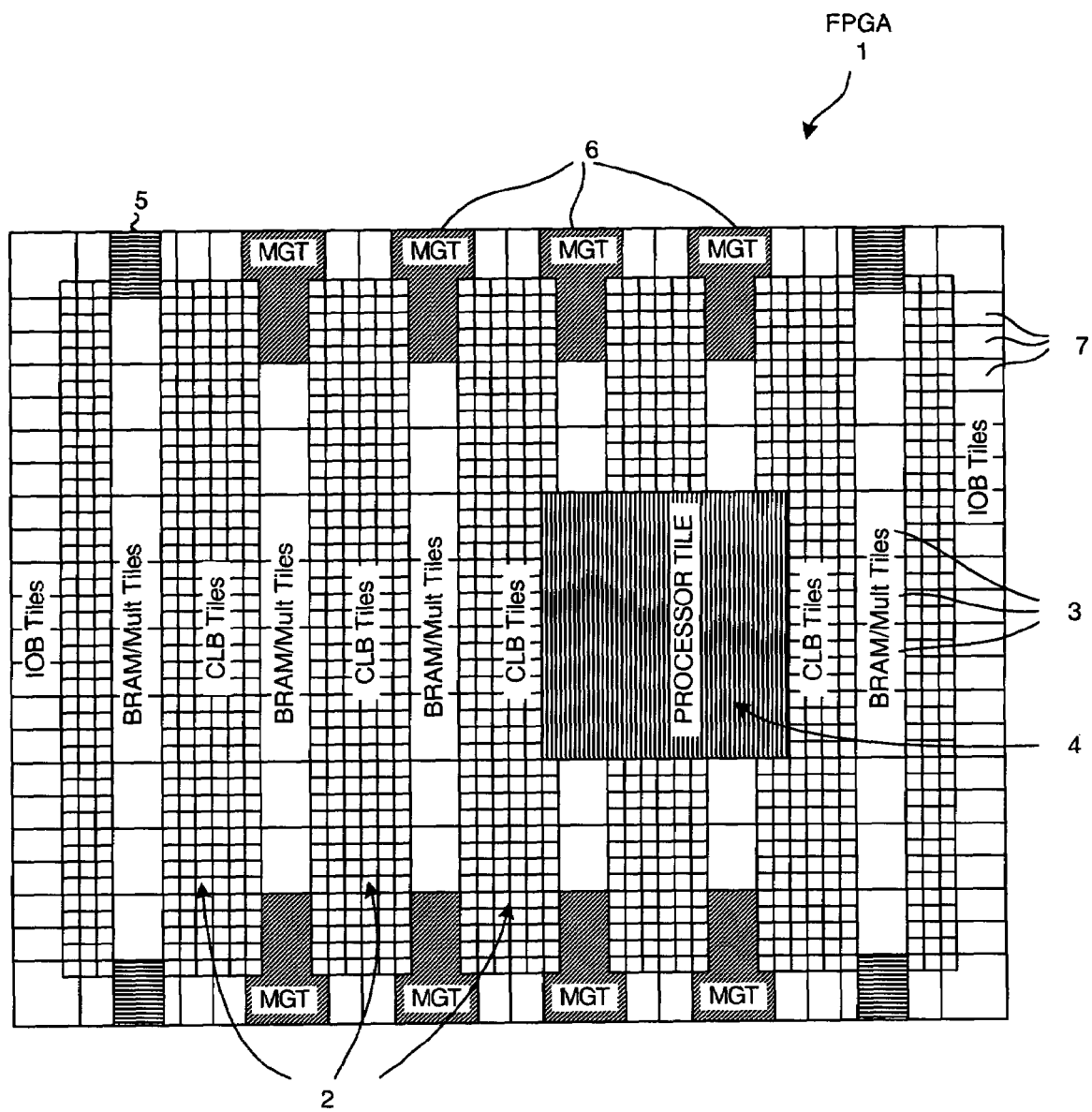
FIG. 1 (Prior Art) is a simplified conceptual diagram of one type of modern FPGA.
Figure 2:
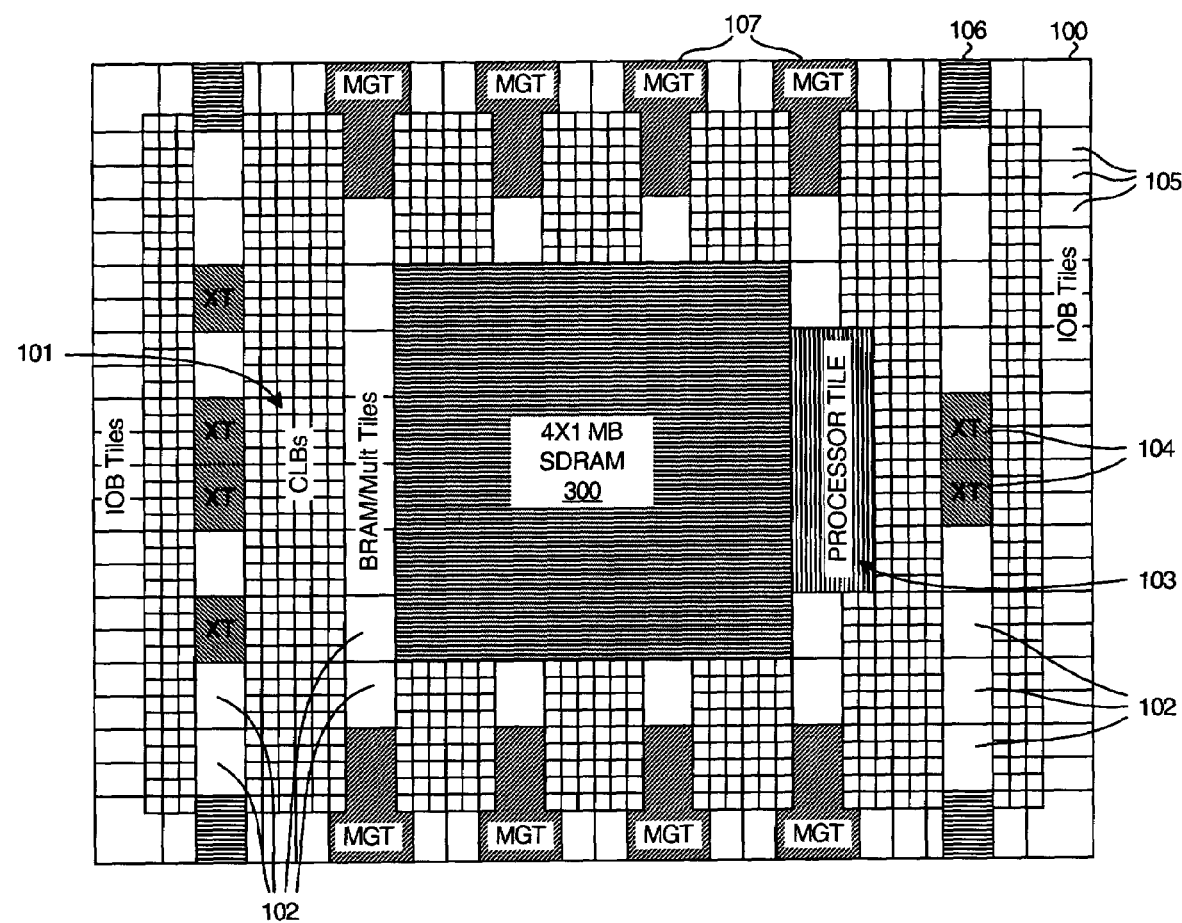
FIG. 2 is a simplified plan view of an FPGA 100 in accordance with one embodiment of the present invention.

FIG. 2 is a simplified conceptual diagram of a field programmable gate array (FPGA) integrated circuit 100 in accordance with one embodiment of the present invention. FPGA 100 includes a central matrix of configurable logic block (CLB) tiles 101 with strips of Block Random Access Memory/Multiplier (BRAM/Mult) tiles 102, a microprocessor tile 103, and a plurality of interconnect (XTILES) tiles 104. This central matrix is surrounded by a ring of input/output block (IOB) tiles 105, a plurality of Digital Clock Manager (DCM) tiles 106, and a plurality of Multi-Gigabit Transceiver (MGT) tiles 107. For additional information on the portions of FPGA 100 other than the XTILES 104, see the Advance Product Specification entitled "Virtex-II Pro Platform FPGAs: Functional Description", Sep. 27, 2002 (the subject matter of which is incorporated herein by reference).

In addition to circuit components for use in user-defined circuits, all of the tiles including the CLB tiles, BRAM/Mult tiles and IOB tiles also contain a portion of the programmable interconnect structure used to connect those components together.

Figure 3:
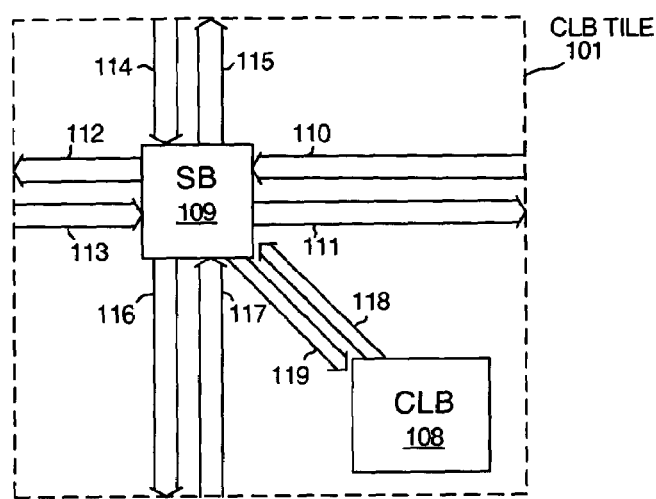
FIG. 3 is a simplified diagram of a CLB tile of FPGA 100.

FIG. 3 is a simplified diagram of one of the CLB tiles 101 that has a portion of the programmable interconnect structure. CLB tile 101 is a rectangular tile that includes a configurable logic block (CLB) 108, a switch box 109, horizontally extending routing conductor segments 110–113, and vertically extending routing conductor segments 114–117. Some of the routing conductor segments are for communicating signals out of the tile. These conductors are designated with an arrow extending to one of the four edges of tile 101 in FIG. 3. Others of the routing conductor segments are for receiving signals into the tile from other tiles. These conductors are designated with an arrows extending from an edge of the tile to switch box 109 in FIG. 3.

As shown in FIG. 2, CLB tiles such as CLB tile 101 of FIG. 3 are disposed adjacent one another in rows and columns such that the horizontally and vertically extending routing conductor segments of adjacent CLB tiles join end-to-end to form routing conductors that join the switch boxes of the adjacent tiles. In one embodiment, CLB portion 108 of CLB tile 101 includes four slices (not shown) of logic and an expansion control block. For additional information on CLB portion 108, its slices and its expansion control block, see U.S. Pat. No. 6,396,302, issued to New et al. (the subject matter of which is incorporated herein by reference).

A signal from CLB portion 108 can be routed onto the routing conductors to other parts of FPGA 100 via output conductors 118 and switch box 109. To perform this function, switch box 109 contains a programmable multiplexing structure (called OMUX) that couples a selected one of output conductors 118 to one of the vertically or horizontally extending routing conductor segments 110–117. Similarly, a signal from elsewhere on FPGA 100 can be routed to CLB 108 via switch box 109 and one of input conductors 119. To perform this function, switch box 109 contains a programmable multiplexing structure (called IMUX) that couples a selected one of the vertically or horizontally extending routing conductor segments 110–117 to a selected one of input conductors 119.

Configuration memory cells (not shown) control the particular selection performed by the IMUX and OMUX structures. Other configuration memory cells (not shown) control how CLB 108 is configured. Configuration data is therefore entered into the configuration memory cells so as to configure the programmable interconnect structure to connect the configured CLBs together in a particular way to realize the user-defined circuit.

Figure 4:
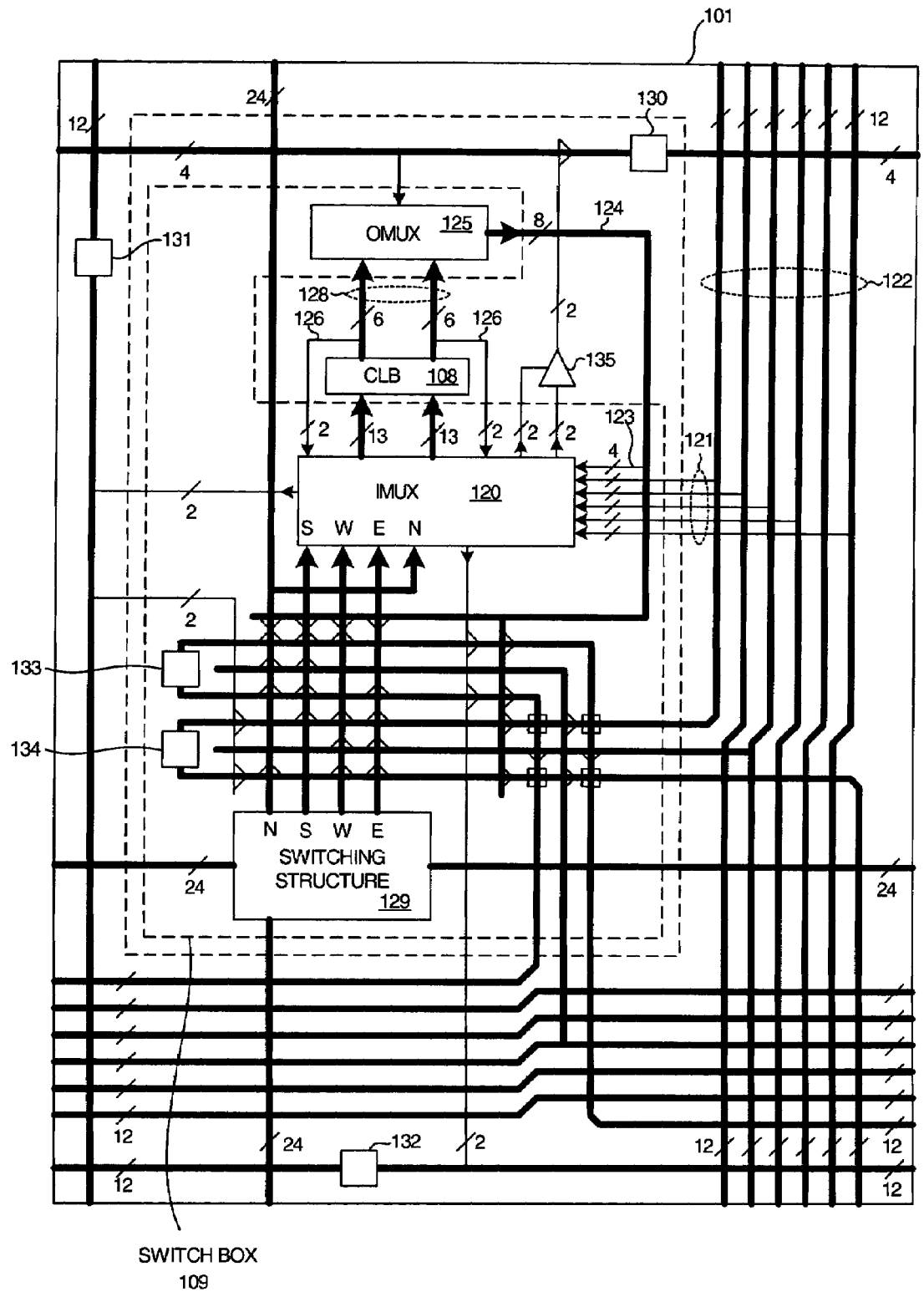
FIG. 4 is a more detailed diagram of the CLB tile of FIG. 3.

FIG. 4 is a more detailed diagram of one specific embodiment of CLB tile 101. In the diagram, an open triangle at an intersection of two conductor segments indicates a programmable connection with signal flow going in one direction only. An open square at an intersection between two perpendicularly extending conductors indicates a programmable connection between the two conductors such that signal flow can go in either direction. The programmable connection is provided by a programmable interconnection point (PIP) structure. See U.S. Pat. No. 5,914,616 for more description of PIP structures. In one embodiment, each PIP includes at least one transistor that programmably adjoins the indicated conductor segments. A conductor segment which ends within the tile is physically terminated within the tile, whereas a conductor segment that extends to the border of the tile connects to a conductor segment on an adjacent tile, which contacts it where the two tiles are abutted together.

IMUX structure 120 accepts signal inputs from: 1) each of buses N, S, E, W; 2) four conductors 121 of each of the 12-conductor vertical buses 122; 3) four conductors 123 from 8-conductor output bus 124 from OMUX 125; and 4) a total of four fast-feedback conductors 126 from CLB 108. In one embodiment, IMUX structure 120 is realized by crossing the input conductors to the IMUX with the output conductors from the IMUX, and by placing PIPs at selected ones of their intersections.

OMUX structure 125 accepts signal inputs from the output conductors 128 of CLB 108, and outputs onto eight conductors 124. As in the case of IMUX 120, OMUX 125 is realized in one embodiment by crossing the input conductors to the OMUX with the output conductors from the OMUX, and by placing PIPs at selected ones of their intersections.

Switch box 109 is realized by crossing the conductors shown with one another in a pattern, and providing PIPs at selected intersections. Switching structure 129 within switch box 109 is also formed by crossing conductors and placing PIPs at selected intersections. Each of boxes 130, 131 and 132 represents a programmable offset region that offsets a bus by one conductor per tile. Elements 133–135 are tri-state buffers. For additional information on one embodiment of IMUX structure 120, OMUX structure 125, switch box 109, and all the other parts of CLB tile 101, see U.S. Pat. No. 5,914,616 (the subject matter of which is incorporated herein by reference). In U.S. Pat. No. 5,914,616, CLB 108 is called a "CLE" or Configurable Logic Element.

Figure 5:
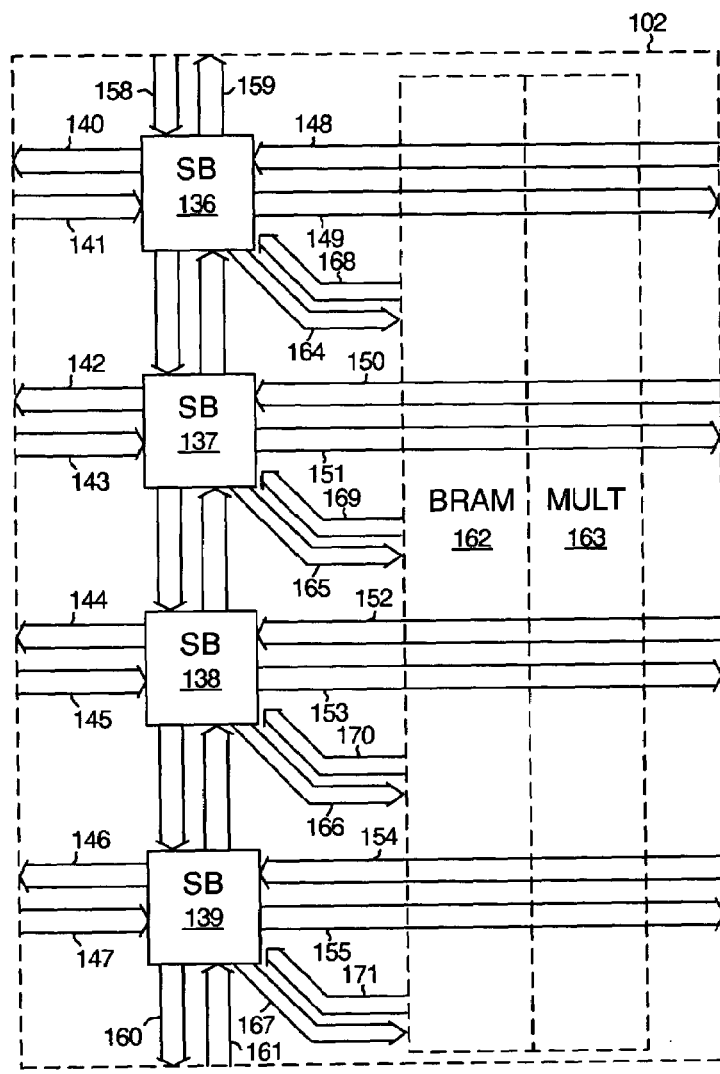
FIG. 5 is a simplified diagram of a BRAM/Mult tile of FPGA 100.

Not only do the CLB tiles 101 of the FPGA of FIG. 2 have switch boxes, but so too do the BRAM/Mult tiles 102. FIG. 5 is a simplified diagram of one of the BRAM/Mult tiles 102. As can be seen from FIG. 2, BRAM/Mult tile 102 is four times as high as a CLB tile. BRAM/Mult tile 102 therefore contains four switch boxes 136–139 such that horizontally extending routing conductor segments 140–155 match up with the horizontally extending routing conductor segments of the CLB tiles to the left and right of BRAM tile 102. Similarly, the vertically extending routing conductor segments 158–161 match up with the vertically extending routing conductors of the BRAM/Mult tiles above and below. The structure and operation of the switch boxes 136–139 in BRAM/Mult tile 102 are of the same general nature as the structure and operation of switch box 109 in CLB tile 101 of FIG. 3.

As shown in FIG. 5, BRAM/Mult tile 102 includes a block of RAM 162 and a multiplier block 163. Signals from the programmable interconnect structure can be routed to the block of RAM 162 and/or to the multiplier block 163 via the switch boxes 136–139 and horizontally extending input conductors 164–167. Similarly, signals from the block RAM 162 and/or multiplier block 163 can be routed out to the programmable interconnect structure of the FPGA via horizontally extending output conductors 168–171 and switch boxes 136–139. In this way, the logic of CLB 108 of CLB tile 101 of FIG. 3 and the BRAM and multiplier of BRAM/Mult tile 102 of FIG. 5 are programmably couplable to the programmable interconnect structure of the FPGA by switch boxes.

Figure 6:
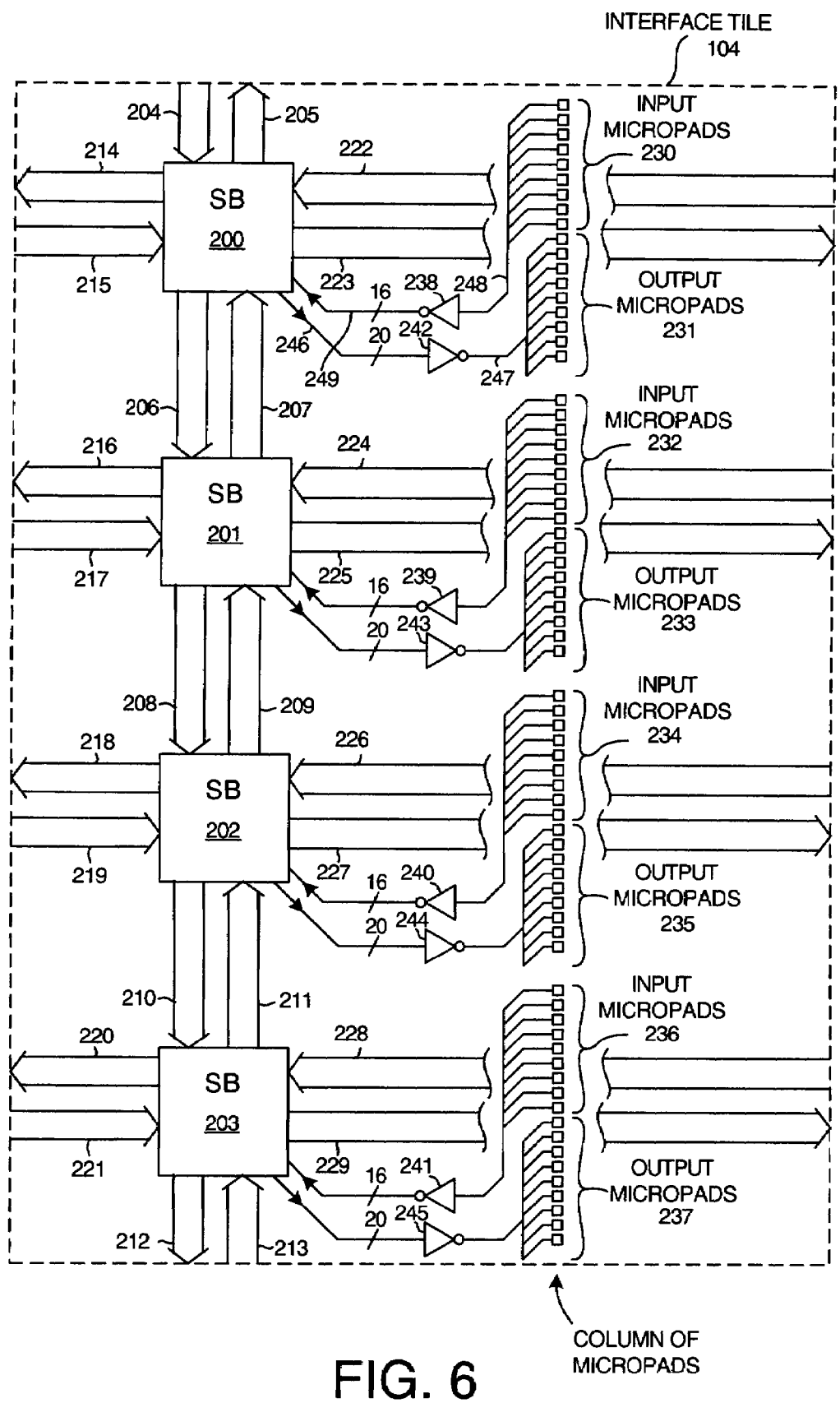
FIG. 6 is a simplified diagram of an interface tile of FPGA 100.

FIG. 6 is a simplified diagram of a novel interface tile (XTILE) 104 of FPGA 100 of FIG. 2 in accordance with an embodiment of the present invention. XTILE 104 has a plurality of switch boxes 200–203 and corresponding sets of vertically extending routing conductor segments 204–213 and horizontally extending routing conductor segments 214–229 that are similar to the switch boxes and routing conductor segments of BRAM/Mult tile 102 of FIG. 5. The locations where the routing conductor segments meet the four edges of XTILE 104 are the same as the locations where the routing conductor segments of BRAM/Mult tile 102 meet the four edges of BRAM/Mult tile 102. These locations are made to be the same so that a BRAM/Mult tile 102 in an existing FPGA product can be easily replaced with an XTILE 104 to create a new FPGA product.

XTILE 104 differs from BRAM/Mult tile 102, however, in that XTILE 104 includes a plurality of micropads 230–237 for coupling FPGA 100 to a second integrated circuit die in stacked relation to FPGA 100. FIG. 2 shows one example of such a second integrated circuit die 300 sitting above FPGA 100. Second integrated circuit die 300 in this example is a 4×1 megabyte SDRAM die.

The switch box and routing conductor segment technique used in the CLB tiles to communicate signals between CLBs and the programmable interconnect structure of the FPGA is used in XTILE 104 of FIG. 6 to communicate signals between the second integrated circuit die 300 and the programmable interconnect structure of the FPGA 100. In the illustrated embodiment of FIG. 6, the location the block RAM circuitry and multiplier circuitry occupied in BRAM/Mult tile 102 of FIG. 5 is occupied in XTILE 104 by micropads 230–237. Although a smaller number of micropads is illustrated in FIG. 6 due to space constraints in the illustration, in a commercial embodiment, each of switch boxes 200–203 is coupled to 161 associated micropads in the real XTILE 104. 64 of these micropads are data input micropads to XTILE 104, 16 are clock and control micropads, and the remaining 81 are data and address output micropads from XTILE 104. Switch box 200, for example, is coupled to input micropads 230 and to output micropads 231. XTILE 104 interface tile, like the BRAM/Mult tile, is approximately 400 microns high and 300 microns wide. Each micropad in this embodiment is a metal pad approximately five microns square. In contrast, the bonding pads of the IOB blocks are approximately 50 microns square in this embodiment. The micropads are therefore considerably smaller than the bonding pads. Unlike an IOB block in this embodiment which is bounded on one side by an edge of the integrated circuit, XTILE 104 in this embodiment has another tile bordering it on each of its four edges.

Switch boxes 200–203 of XTILE 104 are coupled to their associated micropads 230–237 by sets of input buffers 238–241 and sets of output buffers 242–245. The output buffers provide a measure of electrostatic discharge protection and also serve to increase the drive strength off the FPGA. The input and output buffers also provide a signal polarity inversion function and/or level shifting function where necessary.

If, for example, a signal from the programmable fabric of FPGA 100 is to be driven onto one of micropads 231, then the OMUX within switch box 200 is controlled such that the signal is routed onto the appropriate one of output conductors 246, through the corresponding one of output buffers 242, through the corresponding one of output conductors 247, and to the appropriate one of output micropads 231. In some embodiments, the output buffers convert the signaling voltages so that the voltages on the micropads meet the requirements of the external device that receives the signal from micropad 231.

Similarly, if a signal from one of the input micropads 230 is to be supplied onto the programmable fabric of FPGA 100, then the signal is transferred from the appropriate one of input micropads 230, through the corresponding one of the input conductors 248, through the associated one of the input buffers 238, through the associated one of input conductors 249, and to a data input lead of the IMUX in switch box 200. The IMUX is controlled such that the signal is supplied through the IMUX and is driven onto the appropriate one of the horizontal or vertical routing conductor segments extending from switch box 200. Again, in one embodiment, the input buffer adapts signaling voltages of the signals received at input micropads 230 so that the signals supplied to the FPGA 100 meet the signal voltage requirements of the internal logic of FPGA 100.

FIG. 7 is a simplified plan view of FPGA 100 with second integrated circuit die 300 disposed on top of it. FIG. 8 shows how metal traces 301 couple the micropads 230–237 of the XTILEs 104 of FPGA 100 to corresponding micropads 302 on second integrated circuit die 300.

FIGS. 9A and 9B are simplified cross-sectional diagrams of FPGA 100 and second integrated circuit die 300. In one embodiment, the face side of a wafer of second integrated circuits is initially attached to a support wafer (not shown). Prior to this attachment step, the wafer will have preferably been tested to determine which of the second integrated circuits on that wafer are good. The support wafer acts as a mechanical support. The back of the wafer of second integrated circuits is then ground away, for example, by a chemical mechanical polishing (CMP) process. The thickness of the thinned wafer of second integrated circuits can be as small as 20 microns. The thinning of the wafer of second integrated circuits decreases the step-height over which subsequent metal traces must extend.

In the embodiment of FIG. 9A, after the thinning, the wafer of second integrated circuits and its mechanical support are cut into dice and faulty dice are discarded. These dice are then attached to the surface of a wafer of FPGAs such that the second integrated circuit dice are covalently bonded to the surface of a wafer of FPGAs under a slight pressure. Once the good dice including the second integrated circuits and mechanical supports are attached to the wafer of FPGAs, the mechanical supports of the dice are separated from the second integrated circuits of the dice. This leaves a plurality of thin second integrated circuit dice attached to a wafer of FPGAs. Die 300 in FIG. 9A is one such thinned second integrated circuit die.

Still referring to FIG. 9A, once the second dice are attached to the wafer of FPGAs and the mechanical supports are removed, metal connections are made between micropads 230–237 of the interface tiles 104 (see FIG. 8) on the FPGAs of the underlying wafer and exposed micropads 302 (see FIG. 9A) on the attached second integrated circuits die 300. In one embodiment, there are approximately 800 metal connections 301 routed to micropads 302 on second die 300. There are approximately 144 micropads per interface tile 104. An interface tile is 400 microns tall. The micropads 302 therefore have a pitch of a few microns. After metal connections 301 have been made, the wafer of FPGA dice is cut into a plurality of die-assemblies. In the final die assembly, the FPGA die 100 provides mechanical support for the attached thinned second die 300. FIG. 9A is a cross-sectional diagram of one such die-assembly.

FIG. 9B is a cross-sectional diagram of another such die-assembly. In the embodiment of FIG. 9B, the second dice 300 are flipped, and not thinned before attachment. In FIG. 9B, metal connections 301' are formed on FPGA die 100 before second dice 300 are attached. As with FIG. 9A, only good dice are attached to the wafer containing FPGAs 100, and they are attached only to FPGAs 100 that have also tested good. Preferably, micropads are formed on the top surface of FPGAs 100 to mate with micropads 302 on second dice 302.

Although the micropads 230–237 associated with an interface tile are illustrated in FIG. 8 as being disposed within the lateral boundary of the interface tile, this need not be the case. Some or all of the micropads may, for example, be disposed outside the lateral boundary of the interface tile so that metal interconnect extends from the interface tile to outlying micropads spaced at a larger pitch. Particularly, for the embodiment of FIG. 9B, where the second dice have micropads of a larger pitch, the micropads of FPGA 100 will extend beyond the boundary of tile 104. Thus, all processing to electrically connect two dice together is done at a larger pitch.

In one embodiment, second integrated circuit die 300 is a four megabyte SDRAM that includes four one-megabyte SDRAM cores. The IMUX and OMUX functionality of the XTILE 104 provides a 144-bit path between the SDRAM die and the FPGA programmable fabric of the underlying FPGA 100. Sixty-four of the micropads are input micropads, whereas the remainder of the micropads are output micropads.

To read from the SDRAM, data is read from the input micropads of the XTILE. To write data to the SDRAM, data is output to the SDRAM via output micropads of the XTILE.

If a user-defined circuit requires a narrower memory width, then CLBs elsewhere on the FPGA can be used for output multiplexing. This is done by programming the CLBs elsewhere on the FPGA to select narrower words from the 64-bit word output by the SDRAM. Which narrower word is selected is determined according to a part of the address. To write to the SDRAM having the narrower memory width, data is duplicated across the XTILE output micropads.

CLBs located elsewhere on the FPGA can be used to provide byte enables to the SDRAM so that only the appropriate part of the SDRAM is written to. This is done by decoding a part of the address in a CLB and then routing the resulting byte enables to the SDRAM through the interface tile.

Rather than using CLBs to perform the output multiplexing and to generate byte enables to access a variable width block RAM, techniques and circuitry set forth in U.S. Pat. No. 5,715,197 can be employed. The subject matter of U.S. Pat. No. 5,715,197 is incorporated herein by reference.

Figure 10:
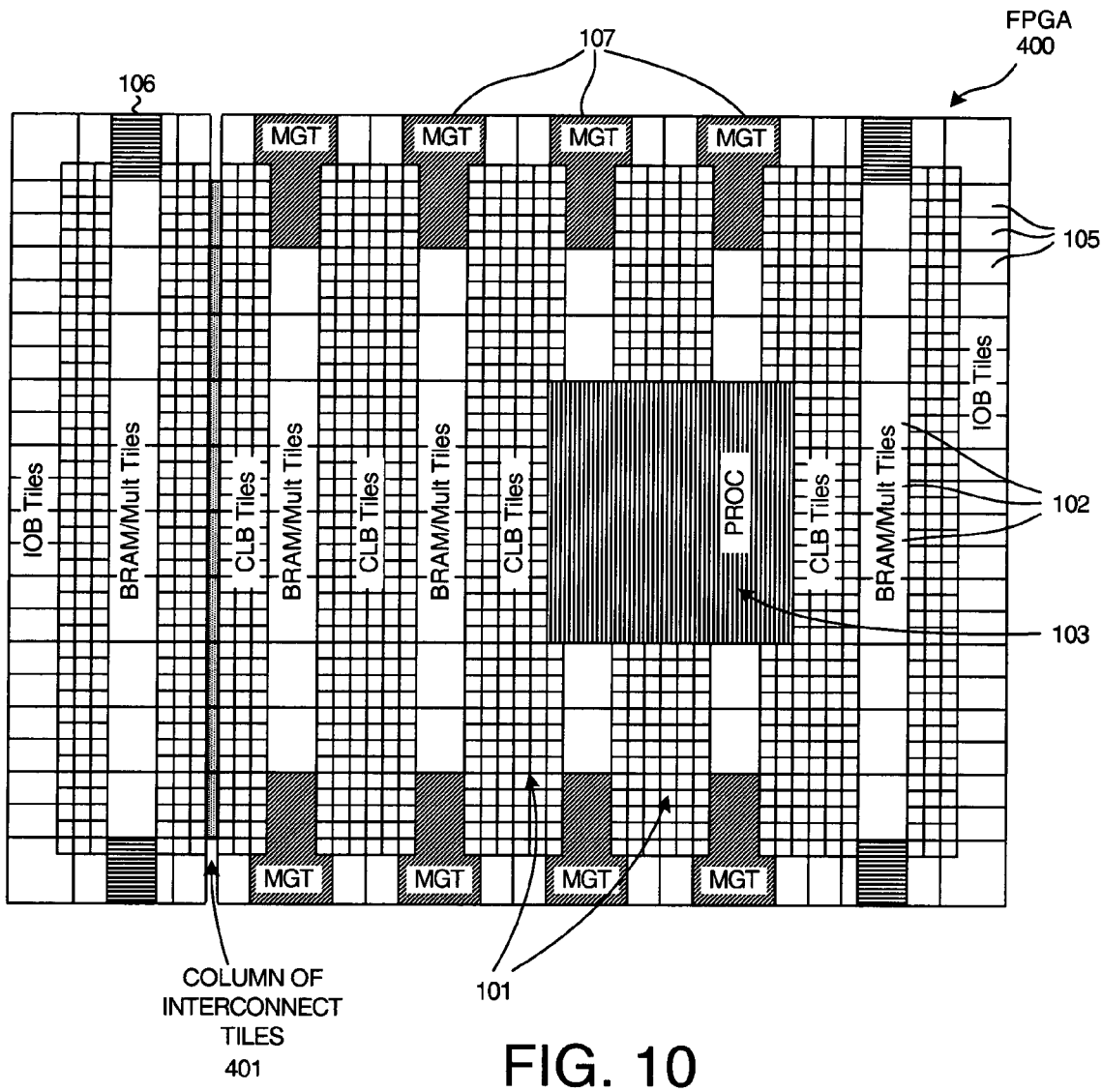
FIG. 10 is a simplified top-down diagram of another embodiment in accordance with the present invention.

FIG. 10 is a floor plan of an FPGA 400 in another embodiment. In this embodiment, each of the CLB tiles includes an interconnect portion and a CLB portion. The interconnect portion is laid out as a sub-tile and the CLB portion is laid out as a sub-tile. The interconnect and CLB sub-tiles are disposed on the FPGA side by side to make up what is illustrated in FIG. 10 as a CLB tile. The interconnect sub-tile is approximately twice as wide as the CLB sub-tile. Both sub-tiles are approximately 100 microns high.

In the embodiment of FIG. 10, the interface tile is not fashioned to replace a BRAM/Mult tile, but rather the interface tile is made to be the same size as the interconnect sub-tile portion of a CLB tile. The micropads of the interface tile may, for example, be disposed in a metal layer over the top of the remainder of the interconnect tile circuitry. The micropads are coupled to the switch box of the interconnect circuitry in the same manner that micropads are connected to the switchboxes in the CLB example of FIG. 6. The vertically and horizontally extending conductor segments of the narrower interface tile connect with the vertically and horizontally extending conductor segments of adjacent CLB tiles in the same manner that the vertically and horizontally extending conductor segments 110–117 of the CLB tile of FIG. 3 connect with the vertically and horizontally extending conductor segments of adjacent CLB tiles. As shown in FIG. 10, the narrower interface tiles of this embodiment are disposed in a column 401. The micropads of the interface tiles of column 401 form a column of micropads on the surface of FPGA 400.

Although the micropads of the interface tiles of the embodiments of FIGS. 7 and 10 can be coupled to a second integrated circuit in the same fashion as is shown in FIG. 9A with metal traces extending up and over the edge of the second die to micropads on the top of the second die, the micropads of the interface tiles are, in other embodiments, coupled to the second integrated circuit in other ways, for example, as shown in FIG. 9B.

Figure 11:
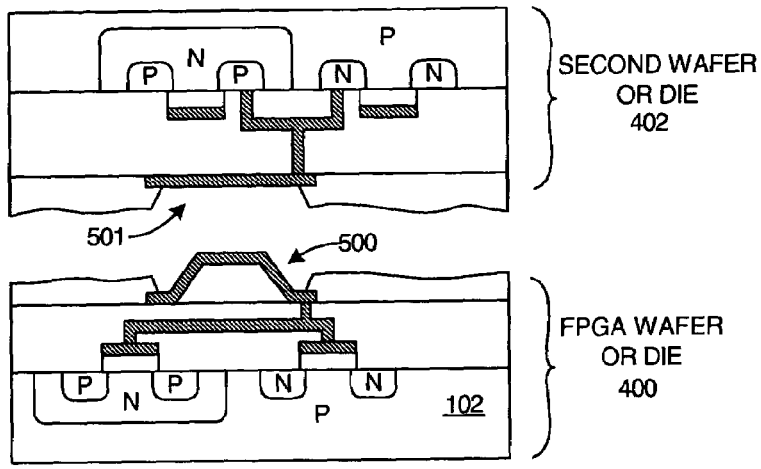
FIGS. 11–13 illustrate a truncated pyramid-shaped micropad structure for use with interface tiles.
Figure 12:
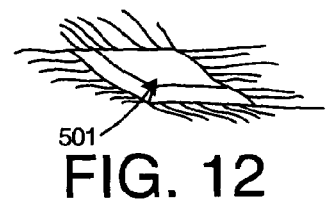
Figure 13:
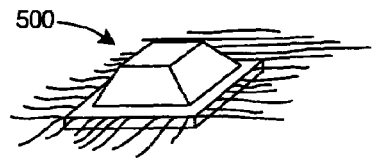

FIG. 11 is a cross sectional diagram that illustrates a second integrated circuit die 402 being mated to FPGA integrated circuit 400. The face side of second integrated circuit die 402 has a plurality of recessed metal micropads 501. Each of these recessed micropads matches up with a corresponding one of a plurality of protruding, metal, truncated pyramid-shaped micropads 500 on the face side of FPGA 400. Because the protruding micropads on FPGA 400 fit into the recessed micropads on second die 402, the coupling of FPGA 400 to second die 402 is self-aligning. The protruding micropads on FPGA 400 are disposed in a column that extends down the column 401 of the interface tiles of the FPGA of FIG. 10. FIG. 12 is a perspective view of the recessed metal micropad structure 501. FIG. 13 is a perspective view of the protruding metal micropad structure 500.

Figure 14:
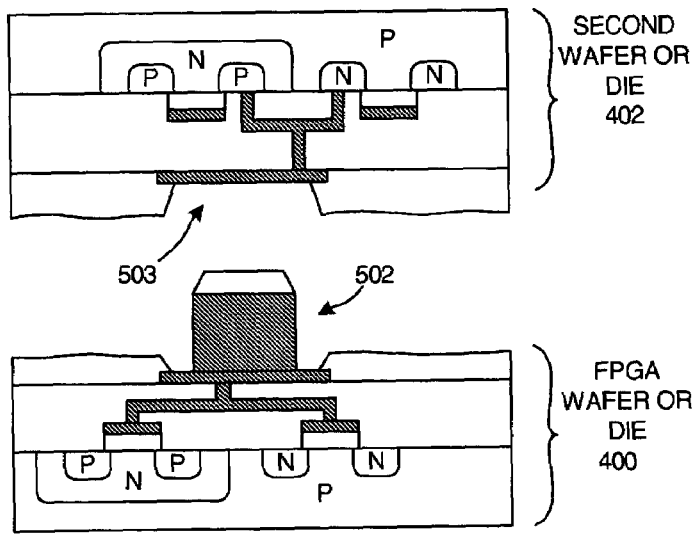
FIGS. 14–16 illustrate a protruding cylindrical plug micropad structure for use with interface tiles.
Figure 15:
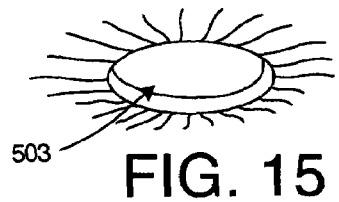
Figure 16:
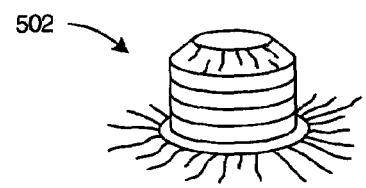

FIG. 14 is a cross-sectional diagram of another embodiment of a self-aligning metal micropad structure usable to couple an FPGA die 400 to a second integrated circuit die 402. In this case, a protruding metal plug 502 on FPGA 400 mates with a corresponding recessed metal micropad 502 on second integrated circuit 402. In one embodiment, plug 502 is formed by depositing a layer (not shown) of oxide over FPGA 400, forming a cylindrical hole into the layer of oxide, depositing metal into the hole to form a metal plug in the hole, chemical mechanical polishing the structure to remove all metal but for the metal in the hole (i.e., the plug), and then removing the oxide layer, thereby leaving the cylindrical plug. FIG. 15 is a perspective view of recessed metal micropad structure 503. FIG. 16 is a perspective view of protruding metal micropad structure 502.

Figure 17:
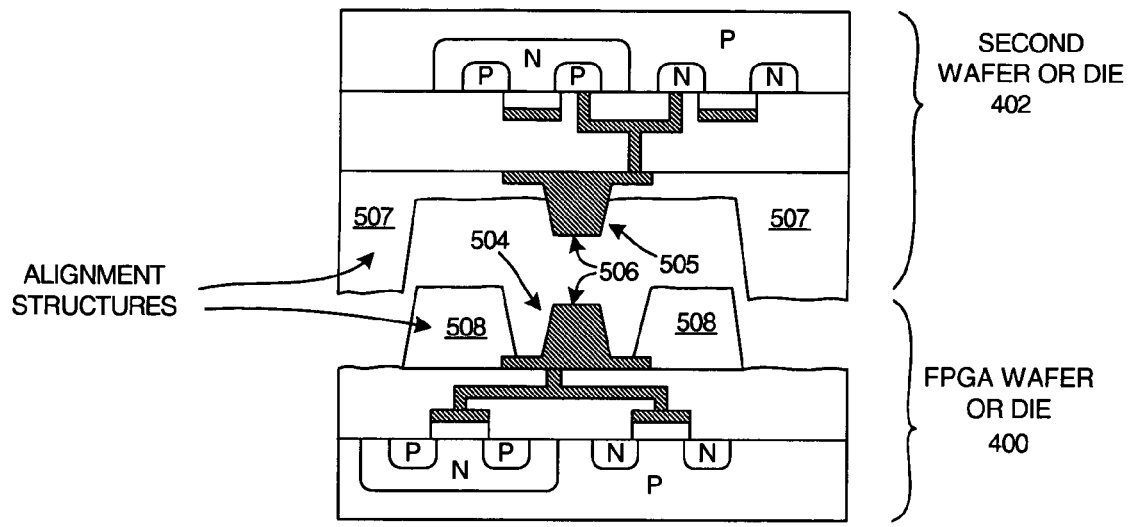
FIGS. 17 and 18 illustrate yet another micropad structure for use with interface tiles.

FIG. 17 is a cross-sectional diagram of yet another embodiment of a self-aligning micropad structure usable to couple an FPGA 400 to a second integrated circuit 402. A micropad structure 504 on FPGA 400 and a micropad structure 505 on second integrated circuit 402 each protrude from their respective integrated circuits such that when the two integrated circuits are pressed together, the end surfaces 506 of the micropads 505 and 504 contact each other and crush or deform in a controlled manner to form a weak bond with one another. FIG. 17 shows the two integrated circuits 400 and 402 shortly before the two micropads contact one another. Alignment structures 507 and 508, here interlocking patterns of oxide on the two integrated circuits, engage one another before the micropads contact one other so that the two integrated circuits 400 and 402 will be properly aligned by the time the two micropads contact one another. The alignment structures can be made to be relatively large as compared to the micropads so that the alignment structures absorb mechanical stresses that would otherwise be experienced by the micropads.

Figure 18:
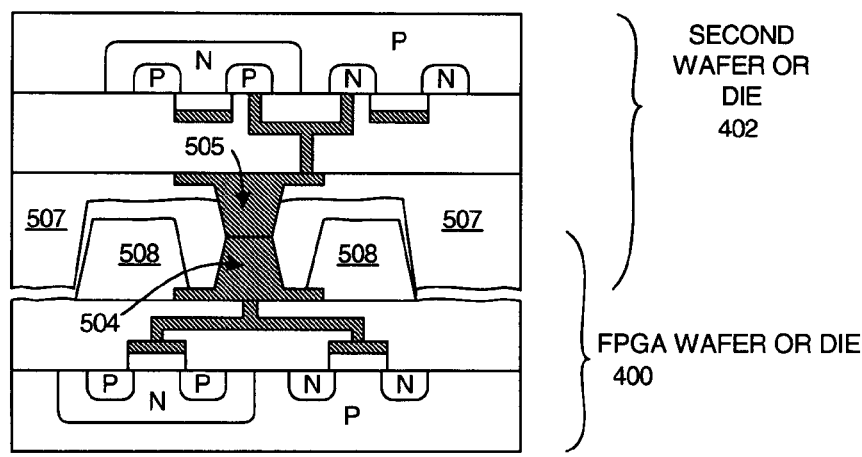

FIG. 18 shows the two integrated circuits 400 and 402 after they have been pressed together. Micropad structures 504 and 505 have formed an electrical connection between FPGA 400 and second integrated circuit 402. Note, however, that alignment structures 507 and 508 do not contact each other at their horizontal surfaces. They are deliberately sized so that micropad structures 504 and 505 contact each other before horizontal surfaces of alignment structures 507 and 508 contact each other as the two integrated circuits are being brought together.

Accordingly, a general purpose interface tile is disclosed that provides a mechanism whereby signals on micropads of the interface tile can be routed onto the interconnect structure of the FPGA and whereby signals on the interconnect structure of the FPGA can be routed out to the micropads of the interface tile. A second integrated circuit die can be mounted onto the underlying FPGA die such that the micropads of the interface tile couple circuitry on the second integrated circuit to circuitry on the FPGA.

In some embodiments, a significant amount of the functionality of an advanced state-of-the-art FPGA is provided by a second integrated circuit that is coupled to an FPGA die through the interface tile, thus allowing this functionality to be achieved with a smaller FPGA die. Because the amount of functionality that has to be provided on the FPGA die is reduced, the FPGA die can be made smaller and less complex. By reducing the size of the FPGA die, yields of the composite assembly (FPGA die and second die) may be increased. Cost of providing the total FPGA solution having the increased functionality is therefore reduced in comparison to the cost of having to provide all the functionality on a single large die that might be relatively unmanufacturable.

In one embodiment, circuitry of an advanced state-of-the-art FPGA requires specialized types of circuit structures. These specialized circuit structures are not provided on the FPGA die, but rather are provided on a second integrated circuit that is coupled to the FPGA die using the interface tile. Complexities associated with trying to make multiple different types of circuit elements on the same integrated circuit are therefore avoided. A nonexhaustive list of circuitry that may be provided on a second integrated circuit in this embodiment includes: high voltage circuitry, specialized analog circuitry, optical transceivers, static memory, dynamic memory, volatile memory, non-volatile memory, bypass capacitors, analog-to-digital converters, digital-to-analog converters, and RF circuitry. And in some embodiments it may be desirable to attach several second integrated circuits to the first integrated circuit to provide more than one of these functions, or to attach more than one second integrated circuit performing the same function.

In some embodiments, some digital circuits that use the same type of circuit structures as the general purpose FPGA circuitry may nevertheless be used by only a relatively small proportion of the users of a particular FPGA. These somewhat special-purpose digital circuits can be provided in the form of special second integrated circuits that are fashioned with a pattern of micropads so that they can be coupled to the micropads of interface tiles on a general purpose FPGA. Users of the general purpose FPGA employing the interface tile can therefore select from one or more of many specialized second integrated circuits, and couple their selected second integrated circuit to the general purpose FPGA by bonding the second integrated circuit and the FPGA integrated circuit together. The coupling of FPGAs and second integrated circuits may be carried out at the time of assembly and packaging by an FPGA manufacturer, or may be performed by an end user who purchases dice and assembles them and packages them. The right to manufacture a second integrated circuit that mates with interface tiles on an FPGA may be licensed by an FPGA manufacturer to a third party. A non-exhaustive list of circuitry that may be provided on a second integrated circuit in this embodiment includes: microprocessors, memories, FPGAs, bus interface units, network interface circuits, digital signal processors, and programmable logic devices.

The pattern of interface tile micropads of a general purpose FPGA can be matched by a micropad pattern present on multiple different types of second integrated circuits. In one embodiment, a user purchases a general purpose FPGA die from an FPGA manufacturer, and then selects between multiple more specialized micropad-pattern-compatible second integrated circuits. The particular second integrated circuit selected provides a function desired by the user that is more specialized that the functions provided by the FPGA die. The micropad-pattern-compatible second integrated circuits need not provide a micropad that matches up with each of the micropads of the FPGA die. Similarly, the micropad-pattern-compatible second integrated circuit can have additional micropads for which there are no corresponding micropads on the FPGA die.

Although certain specific exemplary embodiments are described above in order to illustrate the invention, the invention is not limited to the specific embodiments. An individual second integrated circuit die can be mounted onto an individual FPGA integrated circuit. Second integrated circuits need not be mounted onto a wafer of FPGA integrated circuits. The second integrated circuit die need not be mounted on top of the FPGA die. In some embodiments, the FPGA die is mounted on top of the second integrated circuit die. The second integrated circuit die can be an FPGA and can itself include interface tiles. The FPGA die and the second die can be assembled in face-to-face relation, in back-to-back relation, or the back side of one of the dice can be mounted to the face side of the other of the dice. Finally, and importantly, even though the above description discusses attaching an FPGA die to another die, the principles of the invention are not limited to FPGA dice. Two or more dice of other descriptions may instead be attached to each other by the methods discussed above.

Although an interface tile is described above that includes an IMUX structure, an OMUX structure and buffers, an interface tile in accordance with other embodiments does not include such structures. For example, a micropad can be simply permanently and directly connected to a routing conductor of the FPGA. Although interface tiles are described disposed in a column, this need not be the case. In one embodiment, interface tiles are distributed across the FPGA die in a fairly evenly spaced manner. An interface tile may include a parallel-to-serial circuit and a serial-to-parallel circuit such that streams of serial data are communicated across a pair of coupled micropads. Although an interface tile is described that couples into an FPGA interconnect fabric, an interface tile may also be fashioned that hooks into the routing resources of another type of programmable logic device.

An FPGA micropad may connect directly to an I/O pad (for example, a wire bonding pad) on the FPGA die such that a direct analog signal path is provided from a terminal on the FPGA package, through the FPGA I/O pad, through an interface tile of the FPGA, through an FPGA micropad, up through a micropad on the attached die, and to analog circuitry disposed on the attached die. This direct analog signal path through the interface tile therefore does not include digital logic circuitry. Micropads of an interface tile may be used to communicate analog signals either from an FPGA to an attached die, or from an attached die to an FPGA.

In one embodiment, a very high speed signal is conducted from an FPGA I/O pad and to an attached die without passing through the programmable interconnect structure of the FPGA. In such an example, a metal conductor extends directly from the I/O pad on the face side of the FPGA die, across the face side of the FPGA above the other logic of the FPGA, and to a micropad. This special micropad is coupled to a corresponding micropad on the attached die. If, for example, a multi-gigabit transceiver (MGT) were disposed on an attached second die, then the MGT could communicate with circuitry outside the FPGA package using such a high speed signal path that does not go through the programmable interconnect structure of the FPGA.

In one embodiment, pairs of micropads are not in physical contact with one another, but rather the micropads are capacitively coupled to one another. Although interface tiles may be disposed on the interior of an integrated circuit such that other tiles are disposed adjacent each of the four edges of the interface tile, this need not be the case. In one embodiment, an interface tile having a micropad does not have other tiles bordering it on all four sides. An interface tile may, for example, be disposed along an edge of an integrated circuit like an IOB tile. An IOB tile can, for example, be an interface tile if the IOB tile includes a micropad adapted for coupling to a second integrated circuit that is bonded in stacked relation to the integrated circuit of which the IOB is a part.

For more information and detail on suitable micropad structures for use in connection with the interface tile in accordance with an embodiment of the present invention, and for additional information on how to fabricate such micropads, see: 1) U.S. Pat. No. 6,271,059 issued to Bertin et al., 2) U.S. Pat. No. 6,114,221 issued to Tonti et al., 3)

U.S. Pat. No. 6,410,431 issued to Bertin et al., 4) U.S. Pat. No. 6,444,560 issued to Pogge et al., 5) Published U.S. patent application number US2002/0064906 by Enquist, and 6) U.S. Pat. No. 6,368,930 issued to Enquist. The entirety of each of these patent documents is hereby incorporated by reference. For information on another metal pad structure suitable for coupling an FPGA die and a second integrated circuit die together, see the description of the Cu-Ta bilayer pads that are fused together by applying a compressive force at 400 degrees C. in the article by Banerjee et al., entitled "3D ICs: A Novel Chip Design for Improving Deep-Submicrometer Interconnect Performance and Systems-on-Chip Integration," Proceedings of the IEEE, vol. 89, No. 5, May 2001, by Banerjee et al. (the subject matter of this paper is hereby incorporated by reference).

Although a central core of tiles, including CLB tiles, is surrounded by a ring of IOBs in the FPGAs illustrated in FIGS. 2, 7 and 10, other FPGA layouts are possible. In one embodiment, an FPGA has an entirely columnar layout in that there is no surrounding ring of IOBs. Rather, the FPGA includes a sequence of columns of tiles extending across the FPGA die, wherein each column of tiles extends from the top edge of the FPGA die to the bottom edge of the FPGA die, wherein the tiles of a column all have the same width, and wherein interface tiles are disposed in at least one of the columns.

Accordingly, various modifications, adaptations, and combinations of various features of the described embodiments can be practiced without departing from the scope of the invention as set forth in the following claims.

What is claimed is:

1. An integrated circuit die comprising an array of tiles, the tiles arranged in rows and columns, wherein one of the tiles is a routing tile having four edges, the routing tile having other tiles adjacent each of its four edges, the routing tile comprising:
    a first routing conductor that extends to a first of the four edges of the tile; and
    a micropad that has an exposed and conductive upper surface, the micropad being couplable to the first routing conductor such that a signal received onto the micropad from a source external to the integrated circuit die can be communicated from the micropad to the first routing conductor and to the first of the four edges of the tile;
    wherein the first routing conductor is a conductor segment that extends to the first edge of the tile, and
    wherein the first edge of the tile abuts a second tile, the second tile having a conductor segment that meets the first routing conductor end-to-end at the first edge to form a conductor that extends from a point inside the tile to a point inside the second tile.

2. The integrated circuit of claim 1, wherein the integrated circuit die is a field programmable gate array containing programmable logic, and wherein each of the other tiles adjacent the one tile contains at least some of said programmable logic.

3. The integrated circuit die of claim 1, wherein the tile further comprises:
    a second routing conductor that extends to a second one of the four edges;
    a third routing conductor that extends to a third one of the four edges;
    a fourth routing conductor that extends to a fourth one of the four edges, and wherein the micropad is selectively couplable to any one of the first, second, third and fourth routing conductors such that the signal received onto the micropad from the source external to the integrated circuit die can be communicated from the micropad to a selectable one of the four edges of the tile.

4. The integrated circuit die of claim 1, further comprising a ring of input/output blocks (IOBs) that substantially surrounds the array of tiles, and wherein each of the IOBs has a bonding pad, each of the bonding pads being substantially larger than the micropad of the tile.

5. The integrated circuit die of claim 1, wherein the integrated circuit die is bonded to a second integrated circuit die in a stacked relation.

6. The integrated circuit die of claim 3, wherein the second integrated circuit die is disposed over and covers the tile.

7. The integrated circuit die of claim 1, wherein the integrated circuit die has a face side surface, the micropad being a protruding micropad that protrudes beyond the face side surface.

8. The integrated circuit die of claim 1, wherein the integrated circuit die has a face side surface, the micropad being a recessed micropad that is recessed below the face side surface.

9. The integrated circuit die of claim 1, wherein multiple ones of the tiles of the array are substantially identical to the tile having the micropad.

10. The integrated circuit die of claim 1, wherein the tile further comprises a second micropad that has an exposed and conductive upper surface.

11. The integrated circuit die of claim 1, wherein the tile and the second tile are substantially identical.

12. The integrated circuit die of claim 1, wherein the integrated circuit die is a field programmable gate array (FPGA) having a programmable interconnect structure, the integrated circuit being bonded to a second integrated circuit die in a stacked relation, the tile being usable to couple a signal from the second integrated circuit die into the programmable interconnect structure of the FPGA.

13. The integrated circuit of claim 1, wherein the micropad is permanently coupled to the first routing conductor.

14. A method, comprising:
    providing an interface tile on a first integrated circuit device, the interface tile having four edges, each of the four edges being adjacent another tile of the first integrated circuit device, the interface tile having a micropad that is couplable to a routing conductor of the first integrated circuit device such that a signal received onto the micropad can be communicated from the micropad and onto the routing conductors;
    wherein the routing conductor is a first conductor segment that extends to a first edge of the four edges of the tile and
    wherein one of the tiles adjacent to the interface tile includes a second conductor segment that meets the first routing conductor end-to-end at the first edge to form a conductor that extends from a point inside the interface tile to a point inside the one of the tiles adjacent to the interface tile.

15. The method of claim 14, further comprising:
    coupling a second integrated circuit device to the first integrated circuit device in a stacked relation such that a signal can be transmitted from the second integrated circuit device and to the micropad of the first integrated circuit device.

16. The method of claim 14, wherein the micropad is a protruding micropad that extends outward from a face side surface of the first integrated circuit device.

17. The method of claim 14, wherein the micropad is a recessed micropad that is recessed with respect to a face side surface of the first integrated circuit device.

18. The method of claim 14, wherein the interface tile comprises a multiplexer structure having a data input lead and a data output lead, the data input lead receiving the signal from the micropad, the data output lead outputting the signal to the routing conductor.

19. The method of claim 15, wherein the first integrated circuit device is a programmable logic device, and wherein the second integrated circuit device is a memory device.

20. The method of claim 15, wherein the first integrated circuit device is a programmable logic device, and wherein the second integrated circuit device is an input (I/O) device.

21. The method of claim 15, wherein the first integrated circuit device is a programmable logic device, and wherein the second integrated circuit device is a microprocessor.

22. The method of claim 15, wherein the first integrated circuit device is a programmable logic device, and wherein the second integrated circuit device is an analog integrated circuit device.

23. The method of claim 14, wherein the first integrated circuit has a plurality of identical interface tiles, each of the interface tiles having a plurality of micropads, the micropads of the plurality of interface tiles forming a first pattern, the method further comprising:
    providing a second integrated circuit that has a plurality of micropads disposed in a second pattern, the second pattern substantially matching the first pattern of micropads on the first integrated circuit device; and
    providing a third integrated circuit that has a plurality of micropads disposed in a third pattern, the third pattern substantially matching the first pattern of micropads on the first integrated circuit device, wherein the second integrated circuit and the third integrated circuit are not identical.

24. The method of claim 23, wherein the first integrated circuit further comprises additional micropads that do not have corresponding micropads on the second integrated circuit device.

25. The method of claim 23, wherein the second integrated circuit further comprises additional micropads that do not have corresponding micropads on the first integrated circuit device.

26. The method of claim 23, wherein the second integrated circuit is a memory device and wherein the third integrated circuit device is not a memory device.

27. An integrated circuit die comprising
    a first array of tiles arranged in rows and columns;
    a second array of tiles arranged in rows and columns;
    a column of interconnect tiles positioned between the first and second arrays of tiles;
    a plurality of routing conductors that connect the first and second arrays of tiles to the interconnect tiles;
    a plurality of micropads positioned on an upper surface of the integrated circuit die; and
    a plurality of interconnect conductors connecting each of the interconnect tiles to a corresponding one of the micropads, whereby a signal applied to a micropad can be communicated between the micropad and a respective one of the routing conductors;
    wherein the column of interconnect tiles comprises a plurality of columns of interconnect tiles.

28. The integrated circuit die of claim 27, wherein the micropads are sized to have length and width dimensions larger than a width of the routing conductors.

29. The integrated circuit die of claim 27 wherein CLB tiles occupy a plurality of columns near the column of interconnect tiles.

30. The integrated circuit die of claim 27 wherein the integrated circuit die is a first integrated circuit die and further comprising a second integrated circuit die having micropads connected to the micropads of the first integrated circuit die.

31. The integrated circuit die of claim 30 wherein the second integrated circuit die is a RAM.

32. The integrated circuit die of claim 30 wherein the second integrated circuit die is a microprocessor.

33. The integrated circuit die of claim 30 wherein the second integrated circuit die is an optical interface.

34. The integrated circuit die of claim 30 wherein the second integrated circuit die is an input/output device.

35. The integrated circuit die of claim 30 wherein the second integrated circuit die is a bus interface unit.

36. The integrated circuit die of claim 30 wherein the second integrated circuit die is a digital signal processor.

37. The integrated circuit die of claim 30 wherein the first integrated circuit die is an FPGA.

38. The integrated circuit die of claim 37 wherein the second integrated circuit die is a PLD.

39. An integrated circuit structure, comprising:
    a programmable interconnect structure; and
    interface tile means for coupling a second integrated circuit structure to the programmable interconnect structure of the integrated circuit structure when the second integrated circuit structure and the integrated circuit structure are in a stacked relation, the tile means comprising a micropad for communicating a signal between the integrated circuit structure and the second integrated circuit structure;
    wherein the interface tile means further comprises four edges and a routing conductor couplable to the micropad such that a signal received onto the micropad can be communicated from the micropad and onto the routing conductor;
    wherein the routing conductor is a first conductor segment that extends to a first edge of the four edges of the interface tile means and
    wherein a first edge of the four edges of the interface tile means abuts a second tile means, the second tile means having a second conductor segment that meets the first conductor segment end-to-end at the first edge to form a conductor that extends from a point inside the interface tile means to a point inside the second tile means.

40. The integrated circuit of claim 39, wherein the integrated circuit is a programmable logic device.

41. The integrated circuit of claim 40, wherein the second integrated circuit includes a second micropad, the second micropad contacting the micropad of the tile means when the integrated circuit and the second integrated circuit are in said stacked relation.

* * * * *